US012703659B2

(12) United States Patent
Cheng et al.

(10) Patent No.: US 12,703,659 B2
(45) Date of Patent: Aug. 11, 2026

(54) METHOD OF PERFORMING SELECTIVE ETCH ON ARRAY SUBSTRATE

(71) Applicant: Industrial Technology Research Institute, Hsinchu (TW)

(72) Inventors: Hao-Wen Cheng, Pingtung County (TW); Ming-Huei Yen, Taipei City (TW); Wen-Jin Li, Taipei City (TW); Yu-Ting Guan, Taichung City (TW); Ding-Shiang Wang, Tainan City (TW)

(73) Assignee: Industrial Technology Research Institute, Hsinchu (TW)

( * ) Notice: Subject to any disclaimer, the term of this patent is extended or adjusted under 35 U.S.C. 154(b) by 163 days.

(21) Appl. No.: 18/090,505

(22) Filed: Dec. 29, 2022

(65) Prior Publication Data

US 2024/0217868 A1 Jul. 4, 2024

(51) Int. Cl.

*C03C 15/00* (2006.01)
*C09K 13/04* (2006.01)
*H10P 50/66* (2026.01)

(52) U.S. Cl.

CPC .............. *C03C 15/00* (2013.01); *C09K 13/04* (2013.01); *H10P 50/667* (2026.01)

(58) Field of Classification Search

CPC .......... C09G 1/00–18; H01L 21/00–86; C03C 15/00–025

See application file for complete search history.

(56) References Cited

U.S. PATENT DOCUMENTS 8,278,222 B2 10/2012 Wu et al.
8,796,157 B2 8/2014 Wagner
8,916,479 B1 12/2014 Nowling
9,169,437 B2 10/2015 Cordonier et al.
2004/0200575 A1 10/2004 Bietsch et al.
2010/0270554 A1* 10/2010 Hong ................ H01L 29/78603 438/587
2011/0294300 A1 12/2011 Zhang et al.
(Continued)

FOREIGN PATENT DOCUMENTS

CN 111719157 9/2020
CN 110028971 B * 11/2021 ............. C09K 13/06
(Continued)

OTHER PUBLICATIONS

Pubchem—Hydrogen Peroxide (Year: 2024).*
(Continued)

*Primary Examiner* — Duy Vu N Deo
*Assistant Examiner* — Andrew Keelan Laobak
(74) *Attorney, Agent, or Firm* — JCIPRNET

(57) ABSTRACT

A method of performing a selective etch on an array substrate including the following is provided, and the array substrate includes a substrate and a component layer disposed on the substrate. Deionized water, hydrogen peroxide, and an acid are mixed to prepare a first solution, and the acid includes sulfuric acid, hydrochloric acid, oxalic acid or a combination thereof. An alkoxy silane compound is added to the first solution to prepare a second solution. The array substrate is placed into the second solution to remove the component layer, and an aging second solution is formed. The substrate is taken out from the aging second solution.

8 Claims, 6 Drawing Sheets

(56) References Cited

U.S. PATENT DOCUMENTS

| | | | | |
|---|---|---|---|---|
| 2013/0089701 | A1* | 4/2013 | Hooper | B23K 26/389 438/690 |
| 2015/0048053 | A1 | 2/2015 | Cordonier et al. | |
| 2016/0185595 | A1* | 6/2016 | Chen | G03F 7/405 252/79.3 |
| 2019/0077991 | A1* | 3/2019 | Shinoda | H01L 21/30625 |
| 2022/0081616 | A1* | 3/2022 | Bjelopavlic | B01J 27/16 |

FOREIGN PATENT DOCUMENTS

| | | | | |
|---|---|---|---|---|
| CN | 115506030 | | 12/2022 | |
| JP | H11130467 | | 5/1999 | |
| TW | I297364 | | 6/2008 | |
| TW | I658994 | B * | 5/2019 | |
| WO | WO-2016194614 | A1 * | 12/2016 | B24B 37/00 |
| WO | WO-2019188747 | A1 * | 10/2019 | B24B 37/044 |

OTHER PUBLICATIONS

Pubchem—Water (Year: 2024).*
Pubchem—Sulfuric Acid (Year: 2024).*
Pubchem—Formic Acid (Year: 2024).*
“Notice of allowance of Taiwan Counterpart Application”, issued on Nov. 10, 2023, p. 1-p. 3.

* cited by examiner

METHOD OF PERFORMING SELECTIVE ETCH ON ARRAY SUBSTRATE

TECHNICAL FIELD

The disclosure relates to a method of performing a selective etch on an array substrate, and particularly relates to a method of performing a selective etch on a component layer disposed on a substrate.

BACKGROUND

When recycling a substrate in a discarded array substrate, generally, strong acid and/or strong alkali is directly used to remove components on the substrate. However, the strong acid and/or strong alkali also causes damage to the substrate. Therefore, the final obtained substrate has poor characteristics such as a high surface roughness or a low light transmission rate, so that further surface treatment is needed on the substrate, hence increasing process time and manufacturing cost.

SUMMARY

The disclosure provides a method of performing a selective etch on an array substrate, so that a substrate obtained after performing the selective etch has good characteristics such as a low surface roughness or a high light transmission rate.

The method of performing the selective etch on an array substrate of the disclosure includes the following, and the array substrate has a substrate and a component layer disposed on the substrate. Deionized water, hydrogen peroxide, and an acid are mixed to prepare a first solution, and the acid includes sulfuric acid, hydrochloric acid, oxalic acid or a combination thereof. An alkoxy silane compound is added to the first solution to prepare a second solution. The array substrate is placed into the second solution to remove the component layer, and an aging second solution is formed. The substrate is taken out from the aging second solution.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF THE EMBODIMENTS

Figures 1A, 1B:
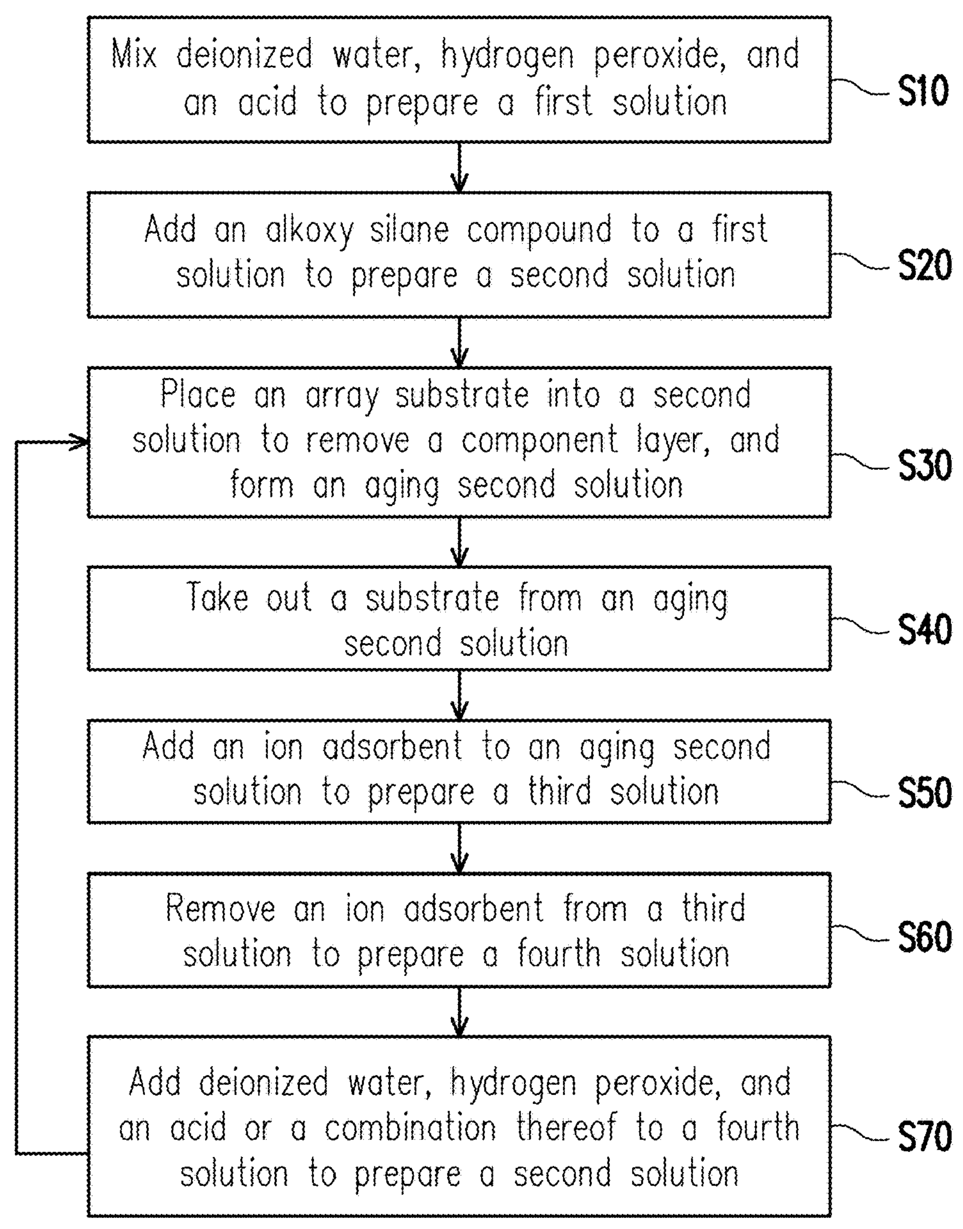
FIG. 1A is a flowchart of a method of performing a selective etch on an array substrate according to an embodiment of the disclosure.
FIG. 1B is a schematic partial cross-sectional diagram of an array substrate according to an embodiment of the disclosure.

The disclosure may be understood by referring to the following detailed description and combined with the accompanying drawings. It should be noted that, in order to make the readers easy to understand and to make the drawings concise, several drawings in the disclosure only depict a part of an electronic device, and certain components in the drawings are not drawn to actual scale. In addition, the number and size of each component in the drawings are only for illustration, and are not intended to limit the scope of the disclosure.

Directional terms mentioned in this disclosure, such as "up", "down", "front", "back", "left", "right", etc., refer to directions in the accompanying drawings. Therefore, the directional terms used herein serve to describe rather than to limit the disclosure. In the drawings, each figure illustrates general characteristics of methods, structures, and/or materials used in particular embodiments. However, these drawings should not be interpreted as defining or limiting the scope or nature covered by the embodiments. For example, relative sizes, thicknesses, and positions of layers, regions, and/or structures may be reduced or exaggerated for clarity.

When a corresponding member (e.g., a film or region) is referred to as being "on" another member, it may be directly on the other member or there may be other members interposed therebetween. On the other hand, when a member is referred to as being "directly on" another member, then there is no member in between. In addition, when a member is referred to as "on another member", the two have a vertical relationship in a plan view direction, and the member can be above or below the other member, and this vertical relationship depends on an orientation of the device.

The terms "about", "equal", "equal" or "same", "substantially" or "approximately" are generally interpreted as being within 20% of a given value or range, or as being within 20% of a given value or range within 10%, 5%, 3%, 2%, 1%, or 0.5% of a value or range.

Ordinal numbers used in the specification and patent claims, such as "first", "second", etc., are used to modify components, and the terms do not imply or represent that the component(s) have any previous ordinal numbers, nor do they represent an order of a component with another component, or an order of a manufacturing method. The use of the ordinal numbers is only used to clearly distinguish a component with a certain designation from another component with the same designation. The specification may not use the same terms as those in the appended claims. Accordingly, a first member in the specification may be a second member in the appended claims.

It should be noted that in the following embodiments, without departing from the spirit of the disclosure, features in several different embodiments may be replaced, reorganized, and mixed to complete other embodiments. As long as the features of the various embodiments do not violate the spirit of the disclosure or conflict, they may be mixed and matched arbitrarily.

Exemplary embodiments of the disclosure are illustrated below, and the same reference numerals are used in the drawings and descriptions to denote the same or similar parts.

FIG. 1A is a flowchart of a method of performing a selective etch on an array substrate according to an embodiment of the disclosure, and FIG. 1B is a schematic partial cross-sectional diagram of an array substrate according to an embodiment of the disclosure.

Please refer to FIG. 1A. In Step S10, deionized water, hydrogen peroxide and an acid are mixed to prepare a first solution. In some embodiments, the hydrogen peroxide may be, for example, a 50% hydrogen peroxide aqueous solution, but the disclosure is not limited thereto. In some embodiments, the acid may include, for example, sulfuric acid, hydrochloric acid, oxalic acid or a combination thereof. Preparing the first solution may, for example, include performing the following, but the disclosure is not limited thereto. First, the deionized water, the hydrogen peroxide, and the acid are added into a container, and a ratio of the deionized water, the hydrogen peroxide, and the acid is 1:1:0.5 to 0.2:0.5:1. Next, the deionized water, the hydrogen peroxide, and the acid are mixed by ultrasonic vibration at a room temperature, so as to be fully mixed.

In Step S20, an alkoxy silane compound is added to the first solution to prepare a second solution. The alkoxy silane compound mentioned here include, for example, alkoxy groups that are hydrolyzable and generate Si—OH after hydrolysis. In this embodiment, the alkoxy silane compound is a compound represented by Formula 1:

$$R_{4-m}\text{—Si—}[O(CH_2)_nCH_3]_m, \quad \text{[Formula 1]}$$

R is hydrogen, alkyl, alkoxy, phenyl, epoxy or a combination thereof, m is a positive integer from 1 to 3, and n is 0 or a positive integer.

For example, in some embodiments, the alkoxy silane compound may include tetramethoxysilane (TMOS), in which R is methoxy, m is 3, and n is 0. In some other embodiments, the alkoxy silane compound may include methyl triethoxysilane (MTEOS), in which R is methyl, m is 3, and n is 1. In other embodiments, the alkoxy silane compound may include phenyltrimethoxysilane, in which R is phenyl, m is 3, and n is 0. It should be noted that, the alkoxy silane compounds listed above are only examples, and the disclosure is not limited thereto.

In addition, in Step S20, preparing the second solution may, for example, include performing the following, but the disclosure is not limited thereto. First, the alkoxy silane compound is added to the above-mentioned container containing the first solution. Next, the first solution and the alkoxy silane compound are mixed by ultrasonic vibration at a temperature of 40° C. to 95° C. and during a time period of 0.5 hour to 2 hours, so as to be fully mixed. In this embodiment, a concentration of the alkoxy silane compound in the second solution is 20 g/l to 120 g/l.

In Step S30, the array substrate is placed into the second solution to remove a component layer, and an aging second solution is formed. In this embodiment, the second solution is an etching solution to perform the selective etch on an array substrate 10, and the array substrate 10 may have, for example, a structure shown in FIG. 1B. Please refer to FIG. 1B. The array substrate 10 may have, for example, a substrate 100 and a component layer 200 disposed on the substrate 100. A surface 100T (the front of the substrate 100) of the substrate 100 faces the component layer 200, and a surface 100B (the back of the substrate 100) of the substrate 100 faces away from the component layer 200, but this disclosure is not limited thereto. In addition, the substrate 100 of this embodiment is a glass substrate, that is, a material of the substrate 100 of this embodiment is, for example, silicon dioxide. In some embodiments, the component layer 200 may include multiple signal lines (not shown), multiple transistors (not shown), and/or multiple electrodes (not shown), but the disclosure is not limited thereto. The above-mentioned multiple signal lines may, for example, include multiple data lines (not shown), multiple scan lines (not shown), and/or other signal lines suitable for the array substrate 10 (such as common voltage lines, power supply lines, working signal lines). In some embodiments, a material of the component layer 200 may include, for example, metal, nitride, metal oxide or a combination thereof. The above-mentioned metal may, for example, include Cu, Mo, Al, Ti and other metals or their alloys suitable for the array substrate 10; the above-mentioned nitride may, for example, include $TiN_x$, $SiN_x$ or other nitrides suitable for the array substrate 10; and the above-mentioned metal oxide may include, for example, ITO, IZO, or other metal oxides suitable for the array substrate 10, and the disclosure is not limited thereto.

Removing the component layer 200 in the array substrate 10 in the second solution may, for example, include performing the following, but the disclosure is not limited thereto. First, the array substrate 10 is placed into the second solution. Next, the second solution is reacted with the array substrate 10 by ultrasonic vibration at a temperature of 40° C. to 95° C. and during a time period of 0.5 hour to 48 hours. The acid and/or alkali included in the second solution can etch the component layer 200 on the array substrate, so that the material (metal, nitride, metal oxide or a combination thereof) included in the component layer 200 is dissolved in the second solution, and the acid and/or alkali included in the second solution is also at least partially consumed during an etching process, and an aging second solution is formed.

In this embodiment, since the alkoxy silane compound in the second solution has reactive groups (alkoxy groups) that can combine with glass (silicon dioxide), the alkoxy silane compound can form a covalent bond with silicon dioxide so that the glass is not etched together with the materials included in the component layer 200 in the second solution. For example, the alkoxy silane compound is added to the first solution and then hydrolyzed to produce Si—OH, and the Si—OH is dehydrated in a subsequent heating reaction to form the covalent bond with the silicon dioxide in the substrate 100, hence a protective layer is formed on surfaces (especially on the back of the substrate 100) of the substrate 100 to protect the substrate 100 from being etched by the acid and/or alkali included in the second solution.

Based on this, through the second solution (etching solution) including the alkoxy silane compound, in this embodiment, an etch selectivity ratio of the component layer 200 relative to the substrate 100 may be equal to or greater than 500, and the etch selectivity ratio is a ratio of etch rates. That is, when the second solution (etching solution) is used to etch the component layer 200, the substrate 100 may be effectively protected to prevent the substrate 100 from being damaged by the second solution (etching solution).

In Step S40, the substrate 100 is taken out from the aging second solution. In this embodiment, after the second solution is reacted with the array substrate 10 by ultrasonic vibration at a temperature of 40° C. to 95° C. and during a time period of 0.5 hour to 48 hours, the component layer 200 is removed to obtain the substrate 100. Since the substrate 100 taken out is protected by the above-mentioned protective layer during the process of removing the component layer 200, the finally obtained substrate 100 has good characteristics such as a low surface roughness or a high light transmission rate, and these characteristics will be further illustrated in the following experimental examples.

Further, in this embodiment, materials other than the substrate 100 may be removed by the second solution (etching solution) including the alkoxy silane compound, that is, the method of performing the selective etch on the array substrate 10 in this embodiment can perform the selective etch on various materials to achieve the effect of a simplified manufacturing process.

So far, the method of performing the selective etch on the array substrate 10 is completed. However, the method of performing the selective etch on the array substrate 10 in the disclosure is not limited thereto.

In some embodiments, the method of performing the selective etch on the array substrate 10 may further include performing the following.

In Step S50, an ion adsorbent is added to the aging second solution to prepare a third solution. In some embodiments, the ion adsorbent may be a conventional metal ion adsorbent, but the disclosure is not limited thereto. The ion adsorbent is, for example, a material for adsorbing the component layer 200 dissolved in the aging second solution, that is, the ion adsorbent may, for example, adsorb metal ions in the aging second solution.

Preparing the third solution may, for example, include performing the following, but the disclosure is not limited thereto. First, an ion adsorbent is added to the specific container mentioned above containing the aging second solution. Next, the aging second solution and the ion adsorbent are mixed by ultrasonic vibration at a room temperature and during a time period of 0.5 hour to 48 hours, so that the ion adsorbent absorbs metal ions of the aging second solution. In this embodiment, a concentration of the ion adsorbent in the third solution is 10 g/l to 100 g/l.

In Step S60, the ion adsorbent in the third solution is removed to prepare a fourth solution. In detail, after the ion adsorbent adsorbs the metal ions of the aging second solution, operations such as sedimentation, centrifugation, and filtration may be performed to remove the ion adsorbent in the third solution, but the disclosure is not limited thereto. It is worth noting that the material of the component layer 200 not adsorbed by the ion adsorbent in the aging second solution may be removed together in this operation, but the disclosure is not limited thereto.

In Step S70, the deionized water, the hydrogen peroxide, and the acid or the combination thereof are added to the fourth solution to prepare a second solution. In some embodiments, a concentration of the deionized water, the hydrogen peroxide, and the acid added to the fourth solution may be calculated first. Afterward, a specific amount of the deionized water, the hydrogen peroxide, and/or the acid is added according to a calculated result to obtain the above-mentioned second solution. That is, a second solution in which a ratio of the deionized water, the hydrogen peroxide, and the acid is 1:1:0.5 to 0.2:0.5:1 is obtained. It is worth noting that the disclosure does not limit a method of calculating the concentration of the deionized water, the hydrogen peroxide, and the acid added to the fourth solution.

Based on this, the used second solution may be regenerated by carrying out Steps S50 to S70, so that the second solution may be applied to Step S30 again, thereby achieving the effect of reducing process cost and reducing environmental damage.

EXPERIMENTAL EXAMPLES

The disclosure will be described below by experimental examples, but these experimental examples are only for illustrating purposes and not intended to limit the scope of the disclosure.

[Experimental Example 1] Etch Performance Test of Second Solution

In this experimental example, the hydrogen peroxide in the second solution is the 50% hydrogen peroxide aqueous solution, the acid is nitric acid, and the alkoxy silane compound is methyltriethoxysilane.

Figure 2B:
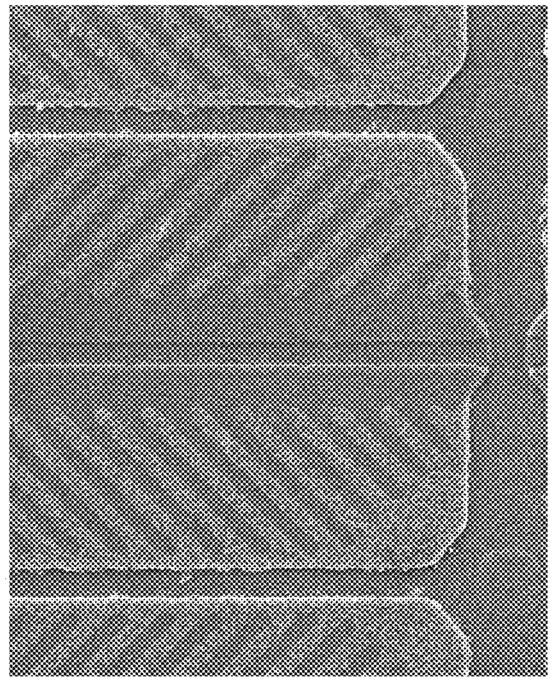
FIG. 2B is a partial photograph of an array substrate after a component layer is removed by the second solution scanned and imaged by a scanning electron microscope.
Figure 2A:
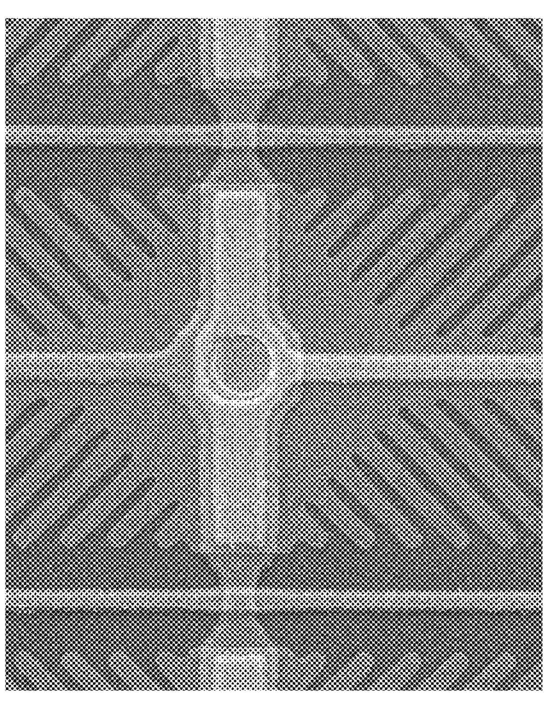
FIG. 2A is a partial photograph of an array substrate including a component layer scanned and imaged by a scanning electron microscope.
Figure 3:
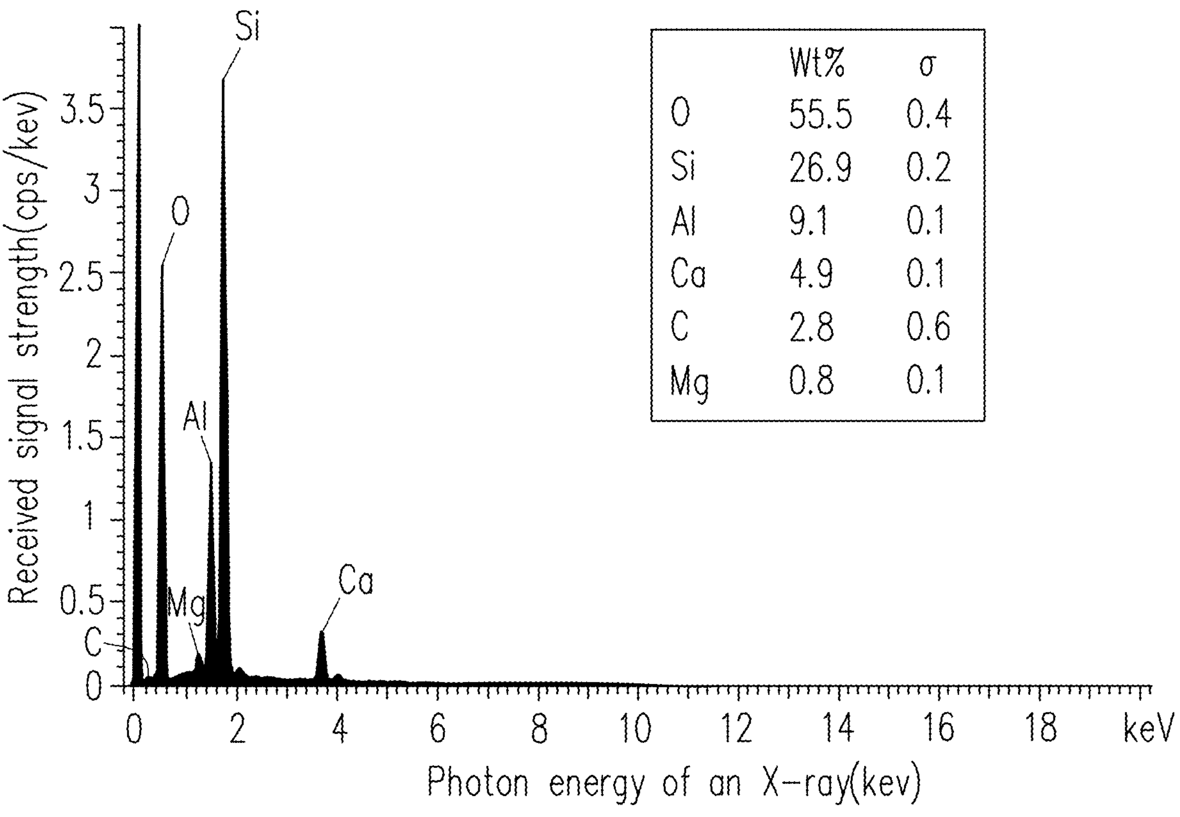
FIG. 3 is an X-ray absorption spectrum after a qualitative analysis and a semi-quantitative analysis are performed on an array substrate after a component layer is removed in FIG. 2B.

FIG. 2A is a partial photograph of an array substrate including a component layer scanned and imaged by a scanning electron microscope, FIG. 2B is a partial photograph of an array substrate after a component layer is removed by the second solution scanned and imaged by a scanning electron microscope, and FIG. 3 is an X-ray absorption spectrum after a qualitative analysis and a semi-quantitative analysis is performed on an array substrate after a component layer is removed in FIG. 2B.

Please refer to FIG. 2A and FIG. 2B at the same time. The component layer in the array substrate shown in FIG. 2A may, for example, include common voltage lines, data lines, and other signal lines (materials are metal and/or metal nitride) and pixel electrodes and common electrodes (materials are metal oxides). FIG. 2B shows the removal of the component layer in the array substrate. A groove in FIG. 2B is a position where the component layer was once disposed, that is, it can be clearly seen that the component layer has been removed by the above-mentioned second solution, and the substrate protected by the protective layer (produced by the covalent bond between the alkoxy silane compound and the silicon dioxide) is not etched by the second solution, and an intact surface is maintained.

Please refer to FIG. 3, a qualitative element analysis and a semi-quantitative analysis are performed by an X-ray fluorescence spectrometer on the array substrate after the component layer is removed. It can be seen from FIG. 3 that elements shown are substantially the same as elements of glass through qualitative analysis, further, it can be roughly known a content of the elements shown is similar to a content of the elements of glass through semi-quantitative analysis. Therefore, it can be clearly seen that the component layer in the array substrate has been removed by the above-mentioned second solution, and the substrate (glass) is left unremoved.

[Experimental Example 2] Measurement of Light Transmission Rate and Surface Roughness In this experimental example, the hydrogen peroxide in the second solution is the 50% hydrogen peroxide aqueous solution, the acid is nitric acid, and the alkoxy silane compound is (3-aminopropyl)triethoxysilane.

Figure 4:
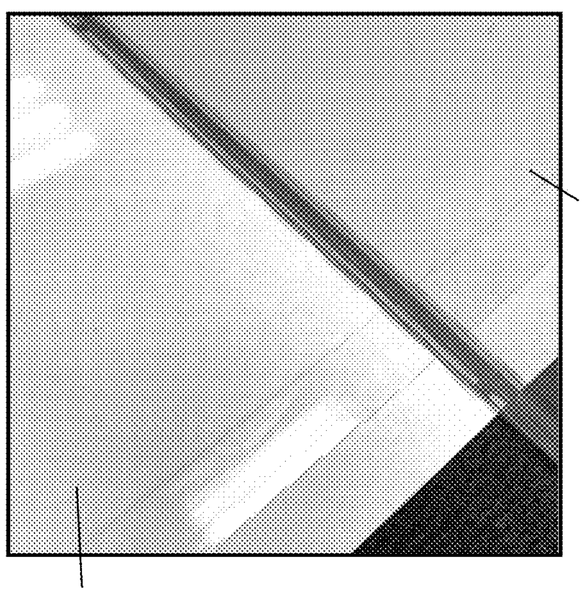
FIG. 4 shows photographs of an array substrate including a component layer and an array substrate after a component layer is removed by a second solution.
Figure 5:
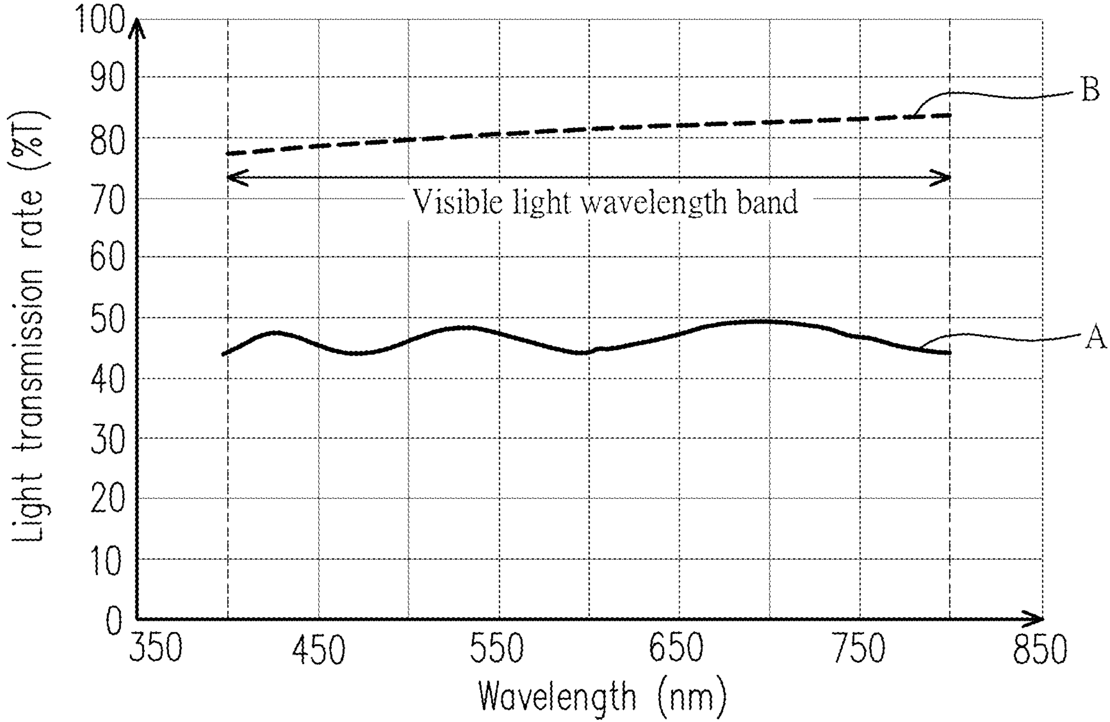
FIG. 5 shows a transmission spectrum of an array substrate including a component layer and an array substrate after a component layer is removed by a second solution.

FIG. 4 shows respective photographs of an array substrate including a component layer and an array substrate after a component layer is removed by a second solution, and FIG. 5 shows a transmission spectrum of an array substrate including a component layer and an array substrate after a component layer is removed by a second solution.

Please refer to FIG. 4. From a macro perspective, a color of the array substrate including the component layer is darker than a color of the array substrate after the component layer is removed by the second solution, which means that a transmission rate of the array substrate including the component layer is higher than a transmission rate of the array substrate after the component layer is removed by the second solution. In addition, FIG. 4 also shows that the surface of the array substrate (substrate) after removing the component layer is smooth. Therefore, it can be seen that the substrate protected by the protective layer (produced by the covalent bond between the alkoxy silane compound and silicon dioxide) is not etched by the second solution, and an intact surface is maintained.

Referring to FIG. 5, a curve A represents a light transmission rate in a visible light region of the array substrate including the component layer, and a curve B represents a light transmission rate in the visible light region of the array substrate after the component layer is removed by the second solution. From a micro perspective, the light transmission rate of the curve B in the visible light region is about 84% to 90%, and the light transmission rate of the curve A in the visible light region is only about 40% to 50%. The transmission rate of the array substrate including the component layer is lower than the transmission rate of the array substrate after the component layer is removed by the second solution, which also means that the component layer may be fully removed by the second solution.

In addition, this experimental example measures the surface roughness of the array substrate including the component layer and the surface roughness of the array substrate after the component layer is removed by the second solution, calculated according to JIS-1994, and experimental data is summarized in the following Table 1.

TABLE 1

| | The surface of the array substrate facing the component layer (the front) | The surface of the array substrate facing away from the component layer (the back) |
|---|---|---|
| The surface roughness of the array substrate before the component layer is removed | Greater than 0.2 micron | Smaller than 0.01 micron |
| The surface roughness of the array substrate after the component layer is removed | 0.11 microns to 0.12 micron | Smaller than 0.01 micron |

It can be seen from Table 1 that the surface roughness of the front of the array substrate after being etched by the second solution is smaller than the surface roughness of the front of the array substrate before being etched by the second solution, so it can be known that the component layer is fully removed by the second solution. In addition, it can also be seen from Table 1 that the surface roughness of the back of the array substrate after being etched by the second solution is substantially the same as the surface roughness of the back of the array substrate before being etched by the second solution, so it can be known that through the protective layer (produced by the covalent bond between the alkoxy silane compound and the silicon dioxide), the protected substrate is not etched by the second solution, and an intact surface is maintained.

[Experimental Example 3] Etch Performance Test after Regeneration of Aging Second Solution In this experimental example, the hydrogen peroxide in the second solution is the 50% hydrogen peroxide aqueous solution, the acid is nitric acid, the alkoxy silane compound is (3-aminopropyl)triethoxysilane, and the ion adsorbent is a layered double hydroxide.

Figure 6B:
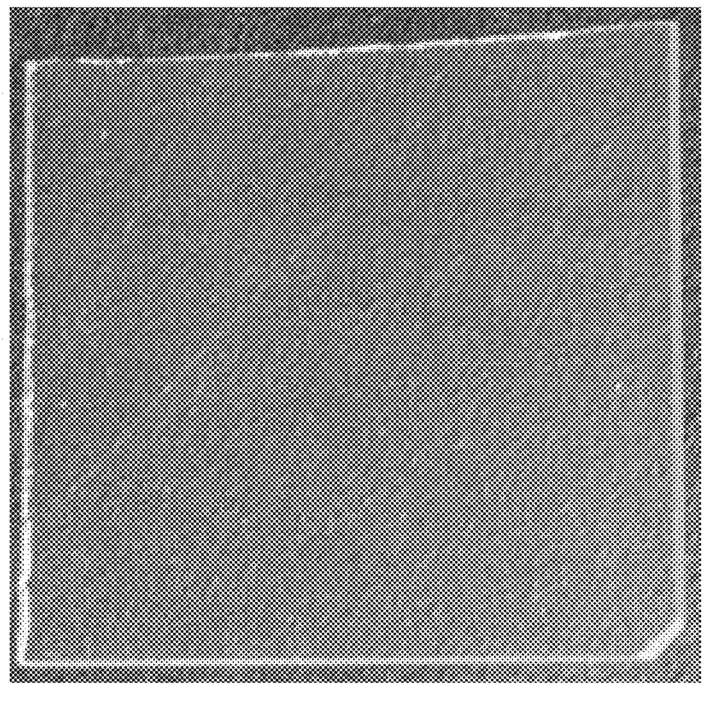
FIG. 6B shows a photograph of an array substrate after a component layer is removed by a second solution of a second regeneration.
Figure 6A:
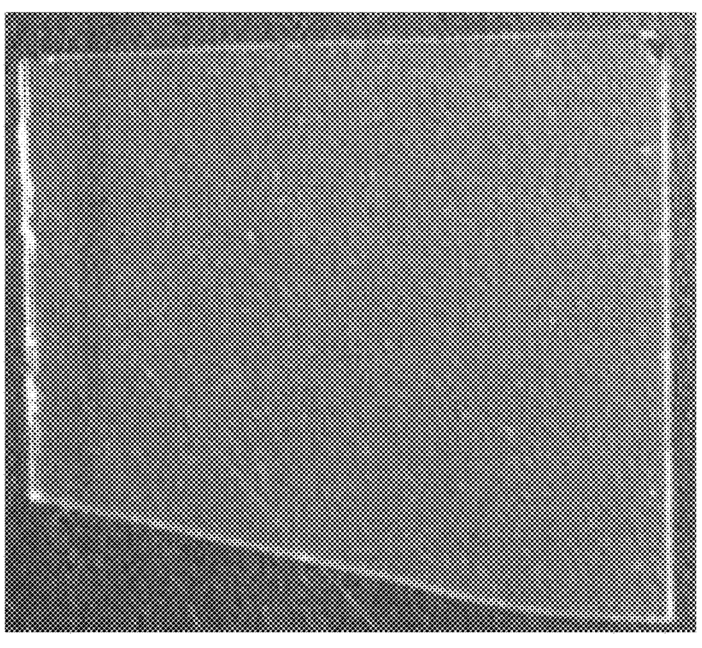
FIG. 6A shows a photograph of an array substrate after a component layer is removed by a second solution of a first regeneration.

The fresh second solution is colorless to pale yellow. While the fresh second solution is aged, the color of aging second solution will become cadmium yellow. After the second solution is regenerated, the color of the regenerated second solution will become colorless to pale yellow again. FIG. 6A shows a photograph of an array substrate after a component layer is removed by a second solution of a first regeneration, and FIG. 6B shows a photograph of an array substrate after a component layer is removed by a second solution of a second regeneration.

The second solution may be regenerated by carrying out the above Step S50 to Step S70 twice. The aging second solution of this embodiment can be successfully regenerated, thereby achieving the effect of reducing process cost and reducing environmental damage.

In addition, this experimental example performs the selective etches on the array substrate including the component layers by (1) the original second solution; (2) the second solution of a first regeneration; and (3) the second solution of a second generation, and the surface roughness of the surface (back) facing away from the component layer in the etched array substrate are summarized in the following Table 2.

TABLE 2

| | (1) Original second solution | (2) Second solution of the first regeneration | (3) Second solution of the second regeneration |
|---|---|---|---|
| The etched area of the array substrate | 600 $cm^2$/1 liter of second solution | 600 $cm^2$/1 liter of second solution | 600 $cm^2$/1 liter of second solution |
| Etch rate | 0.20 g/hour | 0.30 g/hour | 0.22 g/hour |
| The surface roughness of the back of the etched array substrate | Smaller than 0.01 micron | Smaller than 0.01 micron | Smaller than 0.01 micron |

Please refer to FIG. 6A, FIG. 6B and Table 2 at the same time. After performing selective etches on the array substrate including the component layer by (1) the original second solution, (2) the second solution of the first regeneration, and (3) the second solution of the second regeneration, the etched area of the array substrate, the etch rate, and the surface roughness of the back of the etched array substrate are substantially the same or similar. Based on this, the aging second solution of this embodiment can be successfully regenerated through the above Step S50 to Step S70, and may be reapplied to Step S30 to etch the component layer, thereby achieving the effect of reducing process cost and reducing environmental damage.

In summary, the disclosure performs the selective etch on the array substrate by the second solution including the alkoxy silane compound, and through the covalent bond formed by the alkoxy silane compound reacting with the silicon dioxide in the substrate, a protective layer is formed on the surface of the substrate of the array substrate so as to protect the substrate from being etched by the acid and/or alkali included in the second solution. Therefore, the substrate obtained after being etched by the method of performing the selective etch on the array substrate provided in the disclosure has good characteristics such as a low surface roughness or a high light transmission rate.

Furthermore, in the disclosure, materials other than the substrate of the array substrate is removed by performing the selective etch on the array substrate by the second solution including the alkoxy silane compound, that is, the method of performing the selective etch on the array substrate can perform the selective etch on various materials (metals, nitrides, metal oxides) to achieve the effect of a simplified manufacturing process.

In addition, the disclosure can regenerate the second solution used in the method of performing a selective etch on an array substrate, so that the regenerated second solution can be reused, thereby achieving the effect of reducing process cost and reducing environmental damage.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A method of performing a selective etch on an array substrate, wherein the array substrate has a substrate and a component layer disposed on the substrate, wherein the method comprises:

- mixing deionized water, hydrogen peroxide, and an acid to prepare a first solution, wherein the first solution consists of deionized water, hydrogen peroxide, and the acid, wherein the acid is sulfuric acid, hydrochloric acid, oxalic acid or a combination thereof;
- adding an alkoxy silane compound to the first solution to prepare a second solution;
- placing the array substrate into the second solution to remove the component layer, and forming an aging second solution; and
- taking out the substrate from the aging second solution, wherein a material of the substrate is glass,
- wherein the alkoxy silane compound forms a protective layer on the substrate to prevent the substrate from being etched by the acid during the step of removing the component layer,
- wherein in the second solution, a ratio of the deionized water, the hydrogen peroxide, and the acid is 1:1:0.5 to 0.2:0.5:1.

2. The method of performing the selective etch on the array substrate as claimed in claim 1, wherein in preparing the first solution, the deionized water, the hydrogen peroxide, and the acid are mixed by ultrasonic vibration.

3. The method of performing the selective etch on the array substrate as claimed in claim 1, wherein a concentration of the alkoxy silane compound in the second solution is 20 g/l to 120 g/l.

4. The method of performing the selective etch on the array substrate as claimed in claim 1, wherein in preparing the second solution, the first solution and the alkoxy silane compound are mixed by ultrasonic vibration at a temperature of 40° C. to 95° C. and during a time period of 0.5 hour to 2 hours.

5. The method of performing the selective etch on the array substrate as claimed in claim 1, wherein the alkoxy silane compound is a compound represented by Formula 1:

[Formula 1]

$$R_{4-m}\text{—Si—}[O(CH_2)_nCH_3]_m,$$

wherein R is hydrogen, alkyl, alkoxy, phenyl, epoxy or a combination thereof, m is a positive integer from 1 to 3, and n is 0 or a positive integer.

6. The method of performing the selective etch on the array substrate as claimed in claim 1, wherein in removing the component layer, the second solution is reacted with the array substrate by ultrasonic vibration at a temperature of 40° C. to 95° C. and during a time period of 0.5 hour to 48 hours.

7. The method of performing the selective etch on the array substrate as claimed in claim 1, wherein after taking out the substrate from the aging second solution, the method further comprises the following steps:

- adding an ion adsorbent to the aging second solution to prepare a third solution, wherein a concentration of the ion adsorbent in the third solution is 10 g/l to 100 g/l;
- removing the ion adsorbent from the third solution to prepare a fourth solution; and
- adding the deionized water, the hydrogen peroxide, and the acid or a combination thereof to the fourth solution to prepare the second solution.

8. The method of performing the selective etch on the array substrate as claimed in claim 7, wherein in preparing the third solution, the aging second solution and the ion adsorbent are mixed by ultrasonic vibration at a room temperature and during a time period of 0.5 hour to 48 hours.

* * * * *